United States Patent
Koide

[11] Patent Number: 6,121,121
[45] Date of Patent: Sep. 19, 2000

[54] METHOD FOR MANUFACTURING GALLIUM NITRIDE COMPOUND SEMICONDUCTOR

[75] Inventor: Norikatsu Koide, Nara-ken, Japan

[73] Assignee: Toyoda Gosei Co., Ltd, Aichi-ken, Japan

[21] Appl. No.: 09/361,624

[22] Filed: Jul. 27, 1999

[51] Int. Cl.[7] .................................................. H01L 21/20
[52] U.S. Cl. ........................... 438/481; 438/479; 438/341
[58] Field of Search .................................... 438/479, 481, 438/341

[56] References Cited

FOREIGN PATENT DOCUMENTS

| | | |
|---|---|---|
| 03024719 | 2/1991 | Japan . |
| H5-343741 | 12/1993 | Japan . |
| 11-191533 | 7/1999 | Japan . |
| 11-191657 | 7/1999 | Japan . |
| 11-191659 | 7/1999 | Japan . |
| 97/11518 | 3/1997 | WIPO . |
| 98/47170 | 10/1998 | WIPO . |

OTHER PUBLICATIONS

English Abstract of JP 11–191659 to Chocho, et al. (Jul. 1999).
English Abstract of JP 11–191657 to Kiyoku, et al. (Jul. 1999).
English Abstract of JP 11–191533 to Kozaki et al (Jul. 1999).

*Primary Examiner*—Lona Pham
*Attorney, Agent, or Firm*—Pillsbury Madison & Sutro LLP

[57] ABSTRACT

An $Al_{0.15}Ga_{0.85}N$ layer 2 is formed on a silicon substrate 1 in a striped or grid pattern. A GaN layer 3 is formed in regions A where the substrate 1 is exposed and in regions B which are defined above the layer 2. At this time, the GaN layer grows epitaxially and three-dimensionally (not only in a vertical direction but also in a lateral direction) on the $Al_{0.15}Ga_{0.85}N$ layer 2. Since the GaN layer grows epitaxially in the lateral direction as well, a GaN compound semiconductor having a greatly reduced number of dislocations is obtained in lateral growth regions (regions A where the substrate 1 is exposed).

3 Claims, 1 Drawing Sheet

METHOD FOR MANUFACTURING GALLIUM NITRIDE COMPOUND SEMICONDUCTOR

The present application relates to Japanese Patent Application (Hei No. 9-322132) filed on Nov. 7, 1997.

BACKGROUND OF THE INVENTION

1. Field of the Invention

The present invention relates to a gallium nitride group compound semiconductor represented by a general formula $Al_xGa_yIn_{1-x-y}N$ ($0 \leq x \leq 1$, $0 \leq y \leq 1$, $0 \leq x+y \leq 1$), and to a method for manufacturing such a semiconductor. In particular, the present invention relates to a method for manufacturing a gallium nitride group compound semiconductor in which an epitaxial lateral overgrowth (ELO) method is used to form a layer on a substrate.

2. Description of the Related Art

A gallium nitride group compound semiconductor is a direct-transition-type semiconductor having a wide emission spectrum range from ultraviolet to red, and is applied to light-emitting devices such as light-emitting diodes (LEDs) and laser diodes (LDs). The gallium nitride group compound semiconductor is, in general, formed on a sapphire substrate.

However, in the above-described conventional technique, when a layer of a gallium nitride group compound semiconductor is formed on a sapphire substrate, a crack and/or warpage is generated in the semiconductor layer due to a difference in thermal expansion coefficient between sapphire and the gallium nitride group compound semiconductor, and dislocations are generated in the semiconductor layer due to misfit, resulting in degraded device characteristics.

SUMMARY OF THE INVENTION

Accordingly, in light of the above problems, an object of the present invention is to realize an efficient method capable of forming a layer of a gallium nitride group compound semiconductor without generation of cracks and dislocations to thereby improve device characteristics.

In order to solve the above problems, the present invention has a first feature that resides in a method for manufacturing a gallium nitride group compound semiconductor comprising the steps of growing a first gallium nitride group compound semiconductor on a substrate; etching the first gallium nitride group compound semiconductor into an island pattern such as a dot pattern, a striped pattern, or a grid pattern such that substrate-exposed portions are formed in a scattered manner; and growing a second gallium nitride group compound semiconductor which causes epitaxial growth from an island or islands of the first gallium nitride group compound semiconductor serving as nuclei (seeds) but which does not or hardly cause epitaxial growth from the substrate-exposed portions, so that the second gallium nitride group compound semiconductor is formed by lateral growth above the substrate-exposed portions.

The "lateral" direction as used in the specification refers to a direction parallel to a surface of the substrate (surface direction).

By using the above-described method, the second gallium nitride group compound semiconductor does not grow on the substrate-exposed portions, but grows on the island(s) of the first compound semiconductor in a 3-dimensional manner, including growth in the surface direction. And on the upper surface of the substrate, the second gallium nitride group compound semiconductor grows uniformly. Accordingly, dislocations due to misfit between the substrate and the gallium nitride group compound semiconductor grow in the vertical direction, but not in the lateral direction. Consequently, no vertical through-dislocations are generated in the second gallium nitride group compound semiconductor above the substrate-exposed portions, and vertical through-dislocations are generated in portions of the second gallium nitride group compound semiconductor located above the island(s) of the first gallium nitride group compound semiconductor. As a result, the surface density of vertical through-dislocations in the second gallium nitride group compound semiconductor decreases significantly, resulting in improved crystallinity of the second gallium nitride group compound semiconductor. In addition, since there are no chemical junctions between the substrate-exposed portions and the layer of the second gallium nitride group compound semiconductor thereabove, the second gallium nitride group compound semiconductor causes neither warpage nor distortions which would otherwise be caused by stress in the layer.

A second feature of the present invention is that the substrate is made of sapphire, silicon, or silicon carbide. These materials improve the crystallinity of the second gallium nitride group compound semiconductor obtained on the substrate.

A third feature of the present invention is that the substrate is formed of silicon; the first gallium nitride group compound semiconductor formed in an island pattern is formed of a gallium nitride group compound semiconductor containing aluminum, and the second gallium nitride group compound semiconductor is formed of a gallium nitride group compound semiconductor containing no aluminum. The gallium nitride group compound semiconductor containing aluminum grows epitaxially on silicon, but the gallium nitride group compound semiconductor containing no aluminum does not grow epitaxially on silicon. Accordingly, it is possible to form island(s) of the first gallium nitride group compound semiconductor on a silicon substrate, and then form the second gallium nitride group compound semiconductor which grows epitaxially on the island(s) of the first gallium nitride group compound semiconductor but which does not or hardly grow epitaxially on the substrate-exposed portions. Consequently, above the substrate-exposed portions, the second Gallium nitride group compound semiconductor grows epitaxially in a lateral direction from the island(s) of the first gallium nitride group compound semiconductor serving as nuclei (seeds), so that a gallium nitride group compound semiconductor of high crystallinity can be obtained.

DETAILED DESCRIPTION OF THE PREFERRED EMBODIMENT

The present invention will now be described by way of concrete embodiments.

(First Embodiment)

Figure 1A:
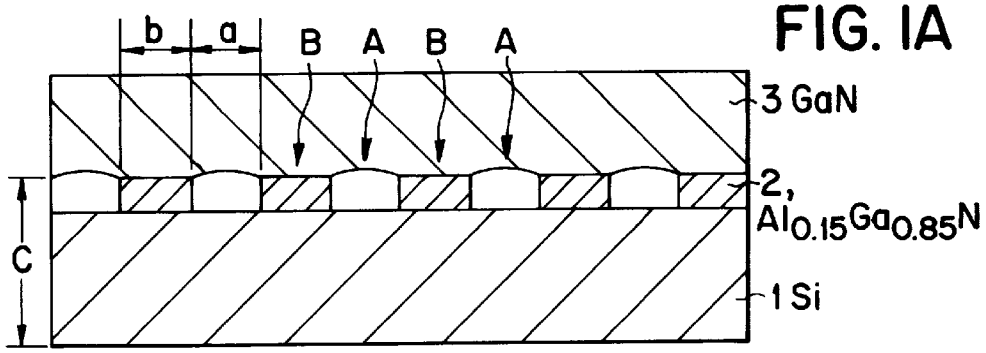
FIGS. 1A to 1C are schematic sectional views showing the structure of a gallium nitride group compound semiconductor according to a first embodiment of the present invention.
Figure 1B:
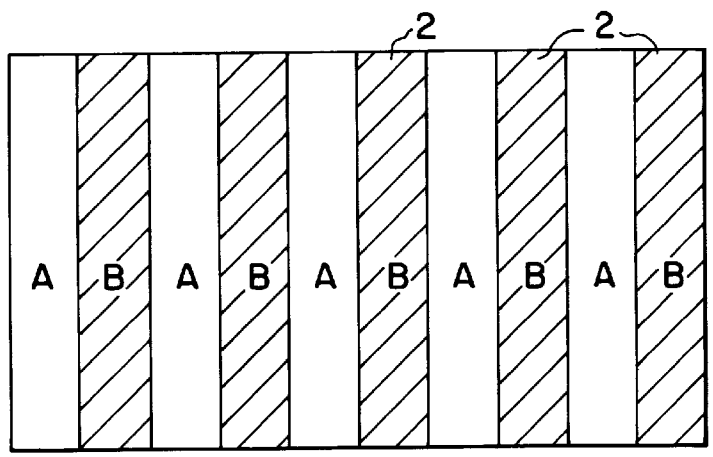
Figure 1C:
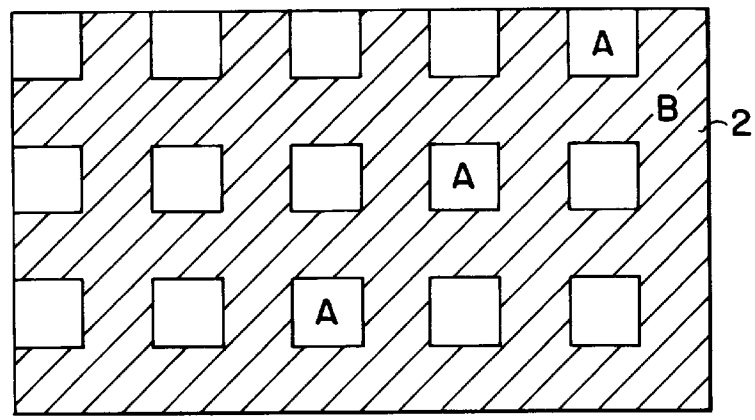

FIG. 1 is a schematic sectional view showing the structure of a gallium nitride group compound semiconductor according to a first embodiment of the present invention. On a silicon substrate 1, an $Al_{0.15}Ga_{0.85}N$ layer (layer of a first gallium nitride group compound semiconductor) 2 having a thickness of about 1000 Å is formed in a striped pattern (FIG. 1(b)) or a grid pattern (FIG. 1(c)). A GaN layer (layer of a second gallium nitride group compound semiconductor) 3 having a thickness of about 10 μm is formed in regions A where the layer 2 is removed from the substrate 1 and in regions B which are defined above the islands of the layer 2.

Next, a process for manufacturing the gallium nitride group compound semiconductor will be described.

The semiconductor is formed through the use of a sputtering method and a metal organic vapor phase epitaxy (hereinafter referred to as "MOVPE") method. Gases used in the MOVPE method are ammonia ($NH_3$), carrier gas ($H_2$, $N_2$), trimethyl gallium ($Ga(CH_3)_3$) (hereinafter referred to as "TMG"), and trimethyl aluminum ($Al(CH_3)_3$) (hereinafter referred to as "TMA").

First, an n-silicon substrate 1 having a principal surface of (111), (100), or (110) and cleaned with aqueous hydrofluoric acid ($HF:H_2O=1:1$) was placed on a susceptor provided in a reaction chamber of an MOVPE apparatus. Then, the substrate 1 was baked for about 10 minutes at 1150° C. under normal pressure in a state in which $H_2$ was fed to the reaction chamber at a flow rate of 2 liters/min.

Subsequently, while the substrate 1 was maintained at 1150° C., $N_2$ or $H_2$ was fed at 10 liters/min, $NH_3$ at 10 liters/min, TMG at $1.0 \times 10^{-4}$ mol/min, trimethyl aluminum ($Al(CH_3)_3$) (hereinafter referred to as "TMA") at $1.0 \times 10^{-5}$ mol/min, and silane, diluted with $H_2$ gas to 0.86 ppm, at $20 \times 10^{-8}$ mol/min, resulting in formation of an $Al_{0.15}Ga_{0.85}N$ layer 2 having a thickness of about 1000 Å and an Si concentration of $1.0 \times 10^{18}$ /cm$^3$.

Then, an $SiO_2$ layer having a thickness of about 2000 Å was formed through sputtering on the $Al_{0.15}Ga_{0.85}N$ layer 2, a photoresist was applied onto the $SiO_2$ layer, and the $SiO_2$ layer was then etched into a predetermined pattern by means of photolithography. Subsequently, the $Al_{0.15}Ga_{0.85}N$ layer 2 was dry-etched while the $SiO_2$ layer having the predetermined pattern was used as a mask. In this manner, the $Al_{0.15}Ga_{0.85}N$ layer 2 was formed in a striped pattern (FIG. 1B) or a grid pattern (FIG. 1C) such that each of the regions B defined above the layer 2 had a width b of about 5 μm and each of the regions A where the substrate 1 was exposed had a width a of about 5 μm.

Then, a GaN layer 3 having a thickness of 10 μm was grown epitaxially in accordance with the MOVPE method, in which the substrate 1 was maintained at 1100° C., and $N_2$ or $H_2$ was fed at 20 liters/min, $NH_3$ at 10 liters/min, TMG at $1.0 \times 10^{-4}$ mol/min, and silane, diluted with $H_2$ gas to 0.86 ppm, at $20 \times 10^{-8}$ mol/min, thereby obtaining an epitaxially grown layer 3. In this case, a GaN layer grows epitaxially on the island(s) of the $Al_{0.15}Ga_{0.85}N$ layer 2, serving as nuclei (seeds). However, the GaN layer does not grow epitaxially in the regions A where the substrate 1 is exposed. In each of the regions A where the substrate 1 is exposed, GaN grows in a lateral direction; i.e., in a surface direction, from the GaN layer grown on the $Al_{0.15}Ga_{0.85}N$ layer 2, which serves as a nucleus. The GaN layer 3 will have dislocations along the vertical direction in only the regions B which are defined above the island(s) of the $Al_{0.15}Ga_{0.85}N$ layer 2. When in the regions A, where the silicon substrate 1 exposed, the GaN layer 3 is grown epitaxially in a lateral direction, the GaN layer 3 will have no dislocations therein. Since the area of the region A where the silicon substrate 1 is exposed is made larger than that of the region B above the $Al_{0.15}Ga_{0.85}N$ layer 2, a GaN layer 3 of excellent crystallinity can be formed over a wide area. In addition, since there are no chemical junctions between the silicon substrate 1 and the GaN layer thereabove, warpage and stress-induced distortion in the GaN layer 3 can be significantly reduced.

Although in the above-described embodiment the regions A where the substrate 1 is exposed and which are formed in a striped or grid pattern has a width of about 5 μm, a preferred range for the width a is 1 μm to 10 μm. This is because when the width a of the regions A becomes larger than 10 μm, a longer time is required for the lateral growth, and when the width a of the regions A becomes smaller than 1 μm, the GaN layer with wide area and high quality becomes difficult. Additionally, although the width b of the regions B defined above the $Al_{0.15}Ga_{0.85}N$ layer 2 is set to 5 μm, a preferred range for the width b is 1 μm to 10 μm. This is because when the width b of the regions B becomes larger than 10 μm, the probability of generation of dislocations increases, and when the width b of the regions B becomes smaller than 1 μm, proper nucleation for the lateral growth becomes difficult. Further, from the viewpoint of the crystallinity of the layer 3, the ratio of the width a of the region A where the silicon substrate 1 is exposed to the width b of the region B which is defined above the $Al_{0.15}Ga_{0.85}N$ layer 2; i.e., a/b, preferably falls within the range of 1 to 10.

Although in the above-described embodiment a silicon substrate is used, any other conductive substrate, such as a sapphire substrate or a silicon carbide substrate, may be employed. When a conductive substrate is used, current can be caused to flow perpendicularly through the substrate through formation of an electrode on the back face of the substrate and formation of an electrode as an uppermost layer of device layers formed on the substrate. This structure improves the current supply efficiency in light-emitting diodes, lasers, and like components.

Although in the present embodiment the layer 2 is formed of a gallium nitride group compound semiconductor whose composition is represented as $Al_{0.15}Ga_{0.85}N$, there may be used a gallium nitride group compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio. However, when a layer is formed epitaxially on the silicon substrate 1, $Al_xGa_{1-x}N$ ($0 \leq x \leq 1$)(including AlN) is preferably used. In addition, as for the layer 3, a gallium nitride group compound semiconductor represented by a general formula $Al_xGa_yIn_{1-x-y}N$ ($0 \leq x \leq 1$, $0 \leq y \leq 1$, $0 \leq x+y \leq 1$) and having an arbitrary composition ratio may be used. In this case, although the composition ratio of the layer 3 may or may not be identical with that of the layer 2, the layer 3 is required to have a composition ratio in order that growing the layer 3 epitaxially on the substrate becomes difficult compared with growing the layer 3 on the layer 2.

In the present embodiment the layer 2 has a thickness of about 1000 Å. When the layer 2 is excessively thick, the possibility of generation of cracks therein increases, and when the layer 2 is excessively thin, the layer 3 will not grow from the layer 2 which serves as a nucleus. For this reason, the thickness of the layer 2 is preferably determined within the range of 500 Å to 2000 Å.

(Second Embodiment)

In the first embodiment, only one layer; i.e., the $Al_{0.15}Ga_{0.85}N$ layer 2, is formed as a layer of the first gallium nitride group compound semiconductor. The present embodiment is characterized in that two layers; i.e., an $Al_{0.15}Ga_{0.85}N$ layer 21 and a GaN layer 22, are formed, in this sequence, as the layer of the first gallium nitride group compound semiconductor.

Figure 2:
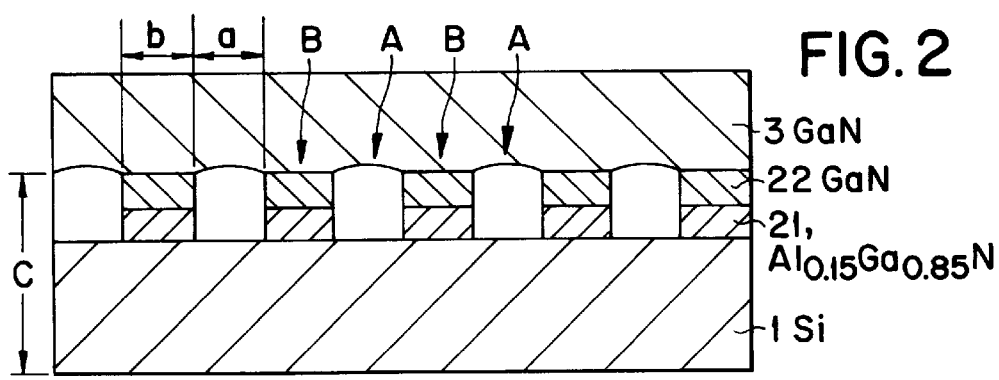
FIG. 2 is a schematic sectional view showing the structure of a gallium nitride group compound semiconductor according to a second embodiment of the present invention.

FIG. 2 is a sectional schematic view showing the structure of a gallium nitride group compound semiconductor according to a second embodiment of the present invention. The $Al_{0.15}Ga_{0.85}N$ layer 21 is formed on the silicon substrate 1 to a thickness of about 1000 Å, and the GaN layer 22 is formed on the layer 21 to a thickness of about 1000 Å. The layer 21 and the layer 22 constitute the layer of the first gallium nitride group compound semiconductor. The layer 21 and the layer 22 are formed in a striped or grid pattern as in the first embodiment. The GaN layer 3 having a thickness of about 10 μm is formed in the regions A where the substrate 2 is exposed, as well as on the layer 22.

The gallium nitride group compound semiconductor of the second embodiment is manufactured in the same manner as in the first embodiment except that, after the layer 21 and the layer 22 are formed uniformly on the silicon substrate 1, the layer 21 and the layer 22 are dry-etched in a striped or grid pattern as shown in FIG. 1(b) or 1(c) while an $SiO_2$ layer having a predetermined pattern is used as a mask. Subsequent formation of the GaN layer 3 is identical with that in the first embodiment.

The growth process of the GaN layer 3 (thickness: about 10 μm) is as follows. In regions B above the GaN layer 22, the GaN of layer 3 grows from the GaN layer 22 in a direction perpendicular to the surface thereof. In the regions A where the silicon substrate 1 is exposed, the GaN of layer 3 grows epitaxially in a lateral direction from the GaN of layer 22 which has been grown in the region B where the layer 22 is exposed and which serves as a nucleus. In this manner, in the present embodiment, a GaN of layer 3 grows epitaxially in vertical and lateral directions from a GaN of layer 22 serving as a nucleus. Consequently, a GaN layer of higher crystallinity compared to that of the first embodiment can be obtained.

In the present embodiment, although the layer 22 and the layer 3 are formed of GaN, the layer 22 and the layer 3 may be formed of a GaN compound semiconductor of an identical composition represented by the formula $Al_xGa_yIn_{1-x-y}N$ ($0 \leq x \leq 1$, $0 \leq y \leq 1$, $0 \leq x+y \leq 1$) may be used. However, the layer 3 is required to have a composition ratio in order that growing the layer 3 epitaxially on the substrate becomes difficult compared with growing the layer 3 on the layer 22. When silicon is used for the substrate, a gallium nitride group compound semiconductor which does not contain Al is preferably used as layer 3. As a matter of course, the compositions of the layer 3 of second gallium nitride group semiconductor may be rendered different from that of the layer 22 of first gallium nitride group semiconductor.

In each of the embodiments discussed above, when the silicon substrate 1 or a portion C from the silicon substrate 1 to the layer 2 or the layer 22 is removed through polishing or etching, a GaN substrate having no dislocations can be obtained. In each of the embodiments described above, GaN is used for the layer 3. However, an InGaN compound semiconductor having an arbitrary composition ratio can be employed. Further, semiconductor layers of other materials may be formed on the layer 3. Especially, additional formation of the gallium nitride group compound semiconductor enables the attainment of devices such as light-emitting diodes and lasers having excellent characteristics.

Moreover, in each of the embodiments described above, a buffer layer of AlGaN or AlGaInN having an arbitrary composition ratio may be formed between the substrate 1 and the layer 2 or the layer 22. The buffer layer has an amorphous structure or a crystalline structure such as a microcrystal-containing amorphous structure which is formed at a temperature lower than the single-crystal growth temperature of the layer 2 and 22.

There can be manufactured a light-emitting diode or laser having a quantum structure such as SQW or MQW in its device layer.

Although in each of the embodiments described above the MOVPE method is performed under atmospheric pressure, the MOVPE method may be performed under a reduced pressure. Further, the MOVPE method may be performed under atmospheric pressure and a reduced pressure in combination.

The GaN compound semiconductor of the present invention can be applied to light-emitting devices such as LEDs and LDs, as well as to photodetectors and electronic devices.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method for manufacturing a gallium nitride group compound semiconductor, comprising the steps of growing a first gallium nitride group compound semiconductor on a substrate;

etching said first gallium nitride group compound semiconductor into an island pattern such as a dot pattern, a striped pattern, or a grid pattern such that substrate-exposed portions are formed in a scattered manner; and growing a second gallium nitride group compound semiconductor which causes epitaxial growth from an island or islands of said first gallium nitride group compound semiconductor serving as nuclei (seeds) but which does not cause epitaxial growth from the substrate-exposed portions, so that said second gallium nitride group compound semiconductor is formed by lateral growth above said substrate-exposed portions.

2. A method for manufacturing a gallium nitride group compound semiconductor according to claim 1, wherein said substrate is made of sapphire, silicon, or silicon carbide.

3. A method for manufacturing a gallium nitride group compound semiconductor according to claim 1, wherein the substrate is formed of silicon; said first gallium nitride group compound semiconductor formed in an island pattern is formed of a gallium nitride group compound semiconductor containing aluminum, and said second gallium nitride group compound semiconductor is formed of a gallium nitride group compound semiconductor containing no aluminum.

* * * * *